US006876748B1

(12) United States Patent
Petroff

(10) Patent No.: US 6,876,748 B1
(45) Date of Patent: Apr. 5, 2005

(54) DIGITAL SIGNAL PROCESSING FOR SYMMETRICAL STEREOPHONIC IMAGING IN AUTOMOBILES

(75) Inventor: Michael L. Petroff, West Hills, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 783 days.

(21) Appl. No.: 09/696,098

(22) Filed: Oct. 25, 2000

Related U.S. Application Data

(60) Provisional application No. 60/179,254, filed on Jan. 31, 2000, provisional application No. 60/163,221, filed on Nov. 2, 1999, provisional application No. 60/162,044, filed on Oct. 26, 1999, and provisional application No. 60/161,276, filed on Oct. 25, 1999.

(51) Int. Cl.[7] ............................ H03G 3/00; H04B 1/00
(52) U.S. Cl. ............................................ 381/97; 381/86
(58) Field of Search ............................. 381/86, 97, 17, 381/302, 303, 305, 1

(56) References Cited

U.S. PATENT DOCUMENTS 4,817,162 A 3/1989 Kihara
5,400,405 A 3/1995 Petroff
5,710,818 A * 1/1998 Yamato et al. ................ 381/86
5,850,453 A * 12/1998 Klayman et al. ............ 381/86
5,854,847 A * 12/1998 Yoshida et al. .............. 381/86
5,872,851 A 2/1999 Petroff
5,970,153 A 10/1999 Petroff
6,038,323 A 3/2000 Petroff
6,038,325 A * 3/2000 Yoshida et al. .............. 381/86
6,477,255 B1 * 11/2002 Yoshida et al. .............. 381/86
6,584,202 B1 * 6/2003 Montag et al. .............. 381/86

* cited by examiner

*Primary Examiner*—Stella Woo
(74) *Attorney, Agent, or Firm*—Harness, Dickey & Pierce, P.L.C.

(57) ABSTRACT

A digital signal processing technique is provided for symmetrical stereophonic image enhancement in an automotive listening environment. The process introduces a rapid rate-of-change of phase shift between the channels, to a maximum of substantially 180 degrees, at substantially 200 Hertz. As an additional feature, spatial enhancement of the reproduced sound may be provided through the application of modified stereo difference signals prior to the image enhancement process.

36 Claims, 4 Drawing Sheets

DIGITAL SIGNAL PROCESSING FOR SYMMETRICAL STEREOPHONIC IMAGING IN AUTOMOBILES

CROSS-REFERENCE TO RELATED APPLICATION

This application claims priority under 35 U.S.C. §119(e) to U.S. Provisional Application Ser. Nos. 60/179,254 filed on Jan. 31, 2000, 60/163,221 filed on Nov. 2, 1999, 60/162,044 filed on Oct. 26, 1999, and 60/161,276 filed on Oct. 25, 1999. The disclosure of these applications are incorporated herein by reference.

FIELD OF THE INVENTION

The present invention relates generally to stereophonic sound reproduction in automobiles and, more particularly, to a digital signal processing technique that provides optimum image localization and spatial enhancement symmetrically at the left and right sides of an automotive listening environment.

BACKGROUND OF THE INVENTION

An acoustic characteristic common to most automotive sound systems is a rapid rate-of-change of the interaural phase difference (IPD) to a maximum of substantially 180 degrees, at substantially 200 Hz, occurring at both the left and right sides of the automotive listening environment. This IPD anomaly typically occupies a narrow "transition region" (e.g., 100 Hertz wide) and occurs in opposite polarities at the left and right sides of the listening environment. Additionally, this IPD anomaly may be characterized as an abrupt, non-linear phase shift as opposed to a linear phase shift or time delay function.

Therefore, it is desirable to provide a digital signal processing technique for symmetrical stereophonic image enhancement in an automotive listening environment. In particular, the technique introduces a rapid rate-of-change of phase shift between the signal channels, to a maximum of substantially 180 degrees, at substantially 200 Hertz. As a result, there exists two 180 degree phase shifts: one occurring naturally in the automotive listening environment and the other provided by the above-described digital signal processing technique. The two phase shifts occur within the narrow transition region, thereby correcting IPD to substantially zero above and below the frequency of the transition region. Since the transition region typically occupies less than 16% of the phase sensitive frequencies between 150 and 800 Hz, the effect of the non-corrected IPD in the transition region is generally not audible. In this way, the present invention provides theoretically optimal symmetrical IPD compensation for an automotive listening environment.

DISCUSSION OF RELATED KNOWN ART

Although each having inherent performance limitations, various analog and digital signal processes have been employed to improve stereophonic imaging in automobiles. For instance, the use of a digital or analog time delay circuit in one stereo channel has been widely practiced and provides improved image localization at the side of an automobile corresponding to the channel in which the delay is applied. This approach provides neither optimal nor symmetrical image enhancement. Moreover, this approach actually degrades image localization at the non-corrected side of the automobile.

U.S. Pat. No. 4,817,162 by Kihara describes a second-order analog phase shifter at substantially 200 Hertz in one channel and a second-order analog phase shifter at substantially 600 Hertz in the remaining channel, each of which provide 360 degrees of phase shift. The displaced frequency 360-degree phase shift functions operating in separate channels differentially interact in such a manner as to provide substantially 180-degrees of phase shift between the channels for frequencies between substantially 200 and 600 Hertz. The Kihara process is inherently limited, however, in terms of the rate-of-change of phase between the channels because the Q factor of the 360-degree phase shifters must be restricted in order to provide 180-degrees of differential phase shift over the desired 200 to 600 Hertz bandwidth. For this reason, the Kihara process does not provide optimum compensation of IPD in an automotive listening environment.

U.S. Pat. No. 5,400,405 by Petroff teaches analog circuitry comprising frequency-selective polarity inversion through analog filter summing and asymmetrical cross coupling to compensate for the closer proximity of one speaker at a selected listening location. A three-position switching system allows user selection of optimum image enhancement at one of three listening locations. The circuit provides asymmetrical rather than symmetrical image localization enhancement in an automobile.

U.S. Pat. No. 6,038,323 by Petroff describes summed analog low-pass and high-pass filters, each having cut-off frequencies at substantially 200 Hz, which are added in-phase and constitute a filter network having a 360-degree phase shift. Such filter network operates in one channel and a first order phase analog shifter providing a 180-degree phase shift operates in the remaining stereo channel, thereby providing a substantially 180-degree differential phase shift between the stereo channels for frequencies above substantially 200 Hz. Although the resulting rate-of-change of phase shift between the channels is superior to that provided by prior art image enhancement processes, it is nevertheless not adequately rapid to enable fully optimized symmetrical correction of IPD in an automobile. Implementation of such circuit through digital signal processing is possible, but presents significant complications and limitations that may be circumvented through alternative digital processes. Specifically, the 360-degree phase shift function in one channel and the 180-degree phase shift function in the remaining channel may be more efficiently and effectively replaced by a digital signal process that more directly provides a rapid rate-of-change phase shift to a maximum of 180-degrees in one channel.

OBJECTS OF THE INVENTION

It is an object of the present invention to describe an image enhancement digital signal process in which optimum stereophonic localization is provided symmetrically at the left and right sides of an automobile.

It is another object of the present invention to describe an image enhancement digital signal process that introduces a rapid rate-of-change of phase shift between the channels, to a maximum of substantially 180-degrees, at substantially 200 Hz.

It is yet another object of the present invention to describe a constant time delay, equal to the fixed delay introduced by the above digital signal process, applied to the non-processed channel to eliminate a delay differential between the channels.

It is still another object of the present invention to describe a spatial enhancement signal process, through the application of equalized and attenuated stereo difference signals prior to the image enhancement signal process, which may be implemented by means of digital signal processing or analog circuitry.

SUMMARY OF THE INVENTION

The present invention is a digital signal processing technique in which optimum stereo localization is provided symmetrically at the left and right sides of an automotive listening environment. The processing technique introduces a rapid rate-of-change of phase shift between the channels, to a maximum of substantially 180-degrees, at substantially 200 Hz. In addition, a constant time delay, equal to the time delay introduced by the above-described processing technique, is applied to the remaining channel. The constant time delay substantially eliminates a fixed delay differential that would otherwise exist between the channels. It is envisioned that the clock frequency of the digital signal process may be adjusted in order to precisely set the frequency at which the rapid rate-of-change of phase shift occurs. In an additional feature of the present invention, equalized and attenuated stereo difference signals may be applied prior to the above-described processing technique, thereby providing spatial enhancement of the reproduced sound.

BRIEF DESCRIPTION OF THE DRAWINGS

The objects and advantages of the present invention will be more fully understood from the following description taken with the accompanying drawings in which.

DETAILED DESCRIPTION OF THE PREFERRED EMBODIMENTS

Figure 1:
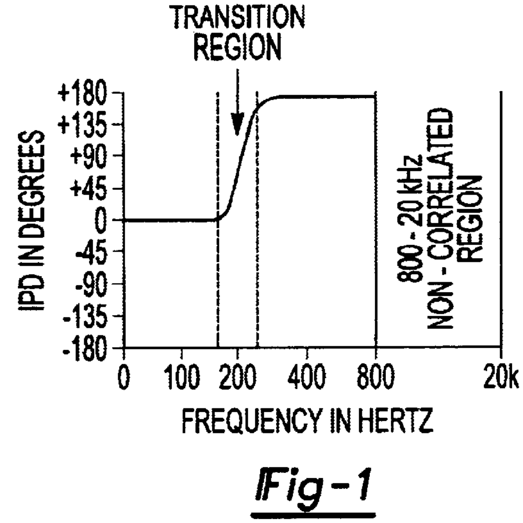
FIGS. 1 and 2 are graphs depicting the uncorrected IPD as measured at the left side and the right side, respectively, of a typical automotive listening environment.
Figure 2:
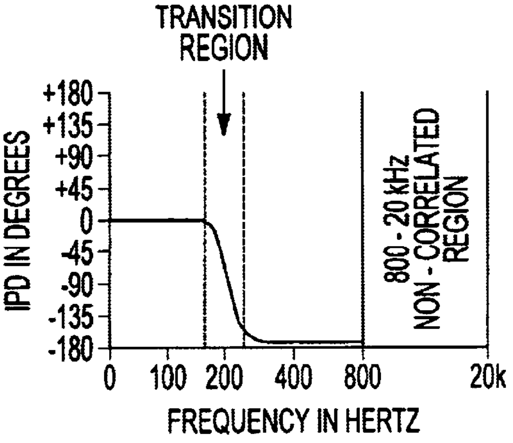

An acoustic characteristic common to most automotive sound systems is a rapid rate-of-change of the interaural phase difference (IPD) occurring at both the left and right sides of the automotive listening environment. FIGS. 1 and 2 illustrate the uncorrected interaural phase difference (IPD) as measured at the left side and right side, respectively, of a typical automotive listening environment. In each figure, IPD is defined as the left ear phase relative to the right ear phase as a function of frequency. Typically, this IPD anomaly occupies a narrow "transition region" (e.g., 100 Hertz wide) and occurs in opposite polarities at the left and right sides of the listening environment.

Figure 3:
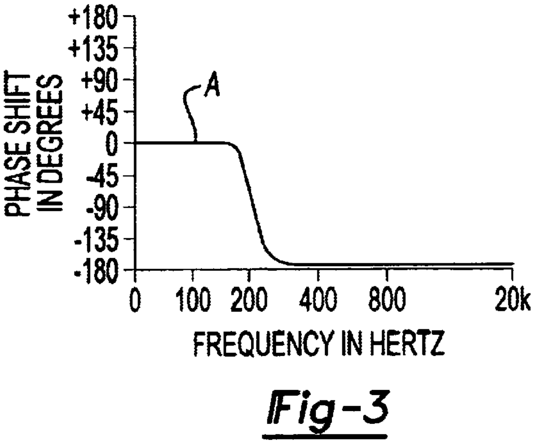
FIG. 3 is a graph depicting the compensating phase shift function, applied to the left channel, as provided by the digital signal processing technique of the present invention.

In accordance with the present invention, a digital signal processing technique is provided for symmetrical stereophonic image enhancement in an automotive listening environment. In particular, the technique introduces a rapid rate-of-change of phase shift between the signal channels, to a maximum of substantially 180 degrees, at substantially 200 Hertz. The compensating phase shift function A as implemented by the digital signal processing technique of the present invention is illustrated in FIG. 3. For purposes of this discussion, the phase shift functions are expressed in terms of the left channel phase in relation to the right channel phase. Although the compensating phase shift function is preferably applied to the left channel or driver's side of the automotive sound system, this phase shift function could also be applied to the right channel of the automotive sound system while still providing symmetrical sterophonic image enhancement as perceived at both sides of the listening environment.

Figure 4:
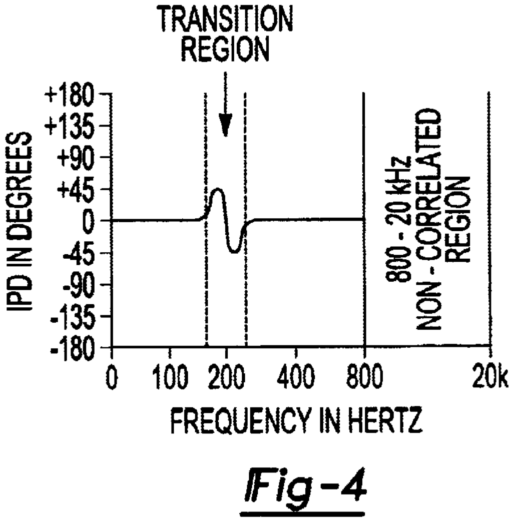
FIGS. 4 and 5 are graphs depicting the corrected IPD resulting from the application of the digital signal processing technique of the present invention, as measured at the left side and the right side, respectively, of an automotive listening environment.
Figure 5:
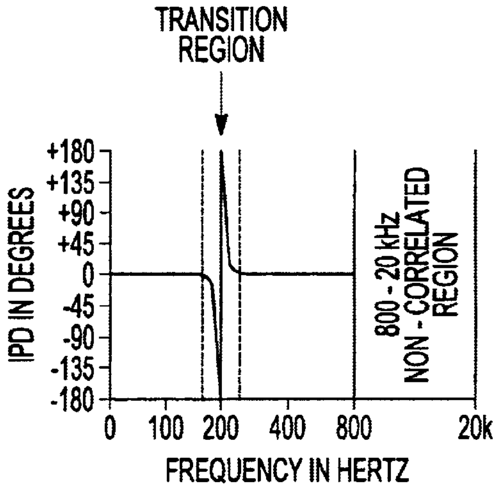

As a result, there exists two 180 degree phase shifts: one occurring naturally in the automotive listening environment and the other provided by the above-described digital signal processing technique. The two phase shifts occur within the narrow transition region, thereby correcting IPD to substantially zero above and below the frequency of the transition region as shown in FIGS. 4 and 5. In addition, since the transition region typically occupies less than 16% of the phase sensitive frequencies between 150 and 800 Hz, the effect of the non-corrected IPD in the transition region is generally not audible. In this way, the present invention provides theoretically optimal symmetrical IPD compensation for an automotive listening environment.

Figure 6:
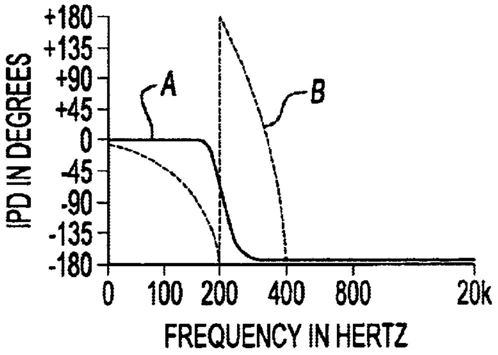
FIG. 6 is a graph that compares the approximate phase shift function of a first prior art image enhancement circuit to the compensating phase shift function of the present invention.
Figure 7:
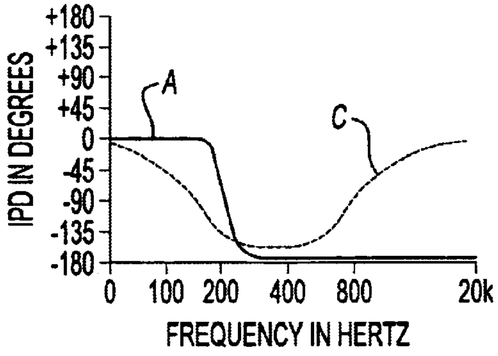
FIG. 7 is a graph that compares the approximate phase shift function of a second prior art image enhancement circuit to the compensating phase shift function of the present invention.
Figure 8:
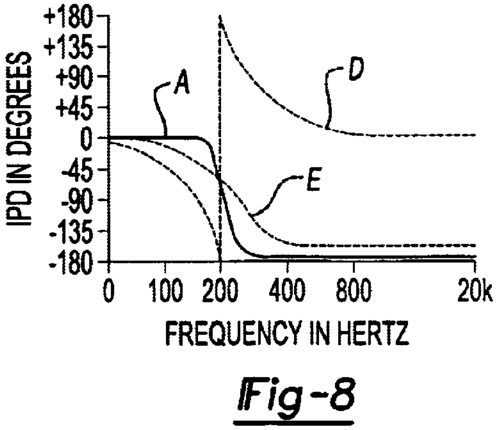
FIG. 8 is a graph that compares the approximate phase shift functions of a third and fourth prior art image enhancement circuits to the compensating phase shift function of the present invention.

FIGS. 6–8 contrast the compensating phase shift function of the present invention with the approximate phase shift functions as produced by four known prior art approaches. FIG. 6 is a graph that compares the approximate phase shift function B, as produced by an image enhancement circuit employing a time delay in one channel, to the compensating phase shift function A of the present invention. FIG. 7 is a graph that compares the approximate phase shift function C, as produced by the image enhancement circuit as described in U.S. Pat. No. 4,817,162, to the compensating phase shift function A of the present invention. FIG. 8 is a graph that compare the approximate phase shift functions D and E as produced by the image enhancement circuits as described in U.S. Pat. Nos. 5,400,405 and 6,038,323, respectively, to the compensating phase shift function A of the present invention. Each of the phase shift functions from the prior art have been approximated to the best of the applicant's understanding.

Figure 9:
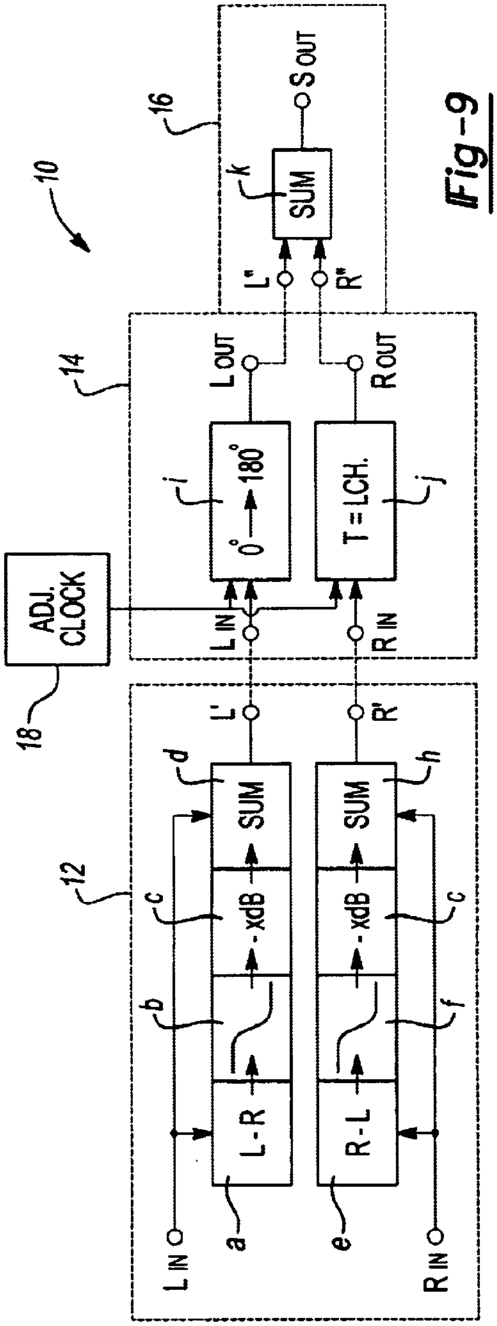
FIG. 9 is a block diagram of a first preferred embodiment of a digital signal processing system in accordance with the present invention.

A preferred embodiment of a digital signal processing system in accordance with the present invention is depicted in FIG. 9. The digital signal processing system 10 generally includes an optional spatial enhancement component 12, a compensating phase shift component 14 and an optional subwoofer component 16. As will be more fully explained below, the compensating phase shift component 14 embodies the principles of the present invention. While the following description is provided with reference to an audio sound system in an automotive environment, it is readily understood that the broader aspects of the present invention may also be applicable to other listening environments where the listener is asymmetrically positioned between the speakers of the audio system.

The spatial enhancement component 12 receives an input stereo signal having a left channel input signal Lin and a right channel input signal Rin. The left channel input signal Lin is applied to subtractor a which in turn derives an L–R stereo difference signal. The output of subtractor a is applied to stepped low-pass filter b having a step attenuation function at a low/mid frequency. The output of low-pass filter b is then applied to attenuator c which provides an attenuation function equal to -xdB (typically O<x<10). The output of attenuator c and the left channel input signal Lin are applied to summer d. Summer d provides as output a spatially enhanced left channel signal L'.

Likewise, the right channel input signal Rin is applied to subtractor e which in turn derives an R–L stereo difference signal. The output of subtractor e is applied to stepped low-pass filter f having a step attenuation function at a low/mid frequency. The output of low pass filter f is applied to attenuator g which provides an attenuation function equal to -xdB (typically O<x<10). The output of attentuator g and right channel input signal Rin are applied to summer h, where summer h provides as output a spatially enhanced right channel signal R'. As will be apparent to one skilled in the art, substractors a and b may cross-connect L–R and R–L difference signals, respectively.

In the above manner, an L–R difference signal is applied to a shelved low-pass filter at a low/midrange frequency, attenuated and mixed with the left input signal. Similarly, an R–L difference signal is applied to a shelved low-pass filter at a low/midrange frequency, attenuated and mixed with the right input signal. As a result, the spatial enhancement component 16 serves to compensate for the absence of long time delay reflected fields commonly found in an automotive listening environment, thereby improving the spatial quality of the reproduced sound. One skilled in the art will readily recognize that the spatial enhancement component may be implemented by either analog or digital circuitry.

In the preferred embodiment, the spatially enhanced left channel signal L' serves as an input to a phase shift subcomponent i. In accordance with the present invention, phase shift subcomponent i introduces a rapid rate-of-change of phase to a maximum of substantially 180-degrees at substantially 200 Hz, thereby producing an output image enhanced left channel signal Lout for driving a left channel amplifier and/or left side speaker(s) of an audio sound system.

An adjustable clock 18 may optionally serve as an input to phase shift subcomponent i. It is envisioned that the clock frequency may dictate the frequency at which the phase shift subcomponent i introduces the rapid rate-of-change. In this way, the frequency at which the rapid rate-of-change occurs may be precisely set to coincide with the naturally occurring phase shift of the particular automotive listening environment.

Concurrently, a time delay is introduced into the spatially enhanced right channel signal R' by a time delay subcomponent j. The time delay is equal to the fixed time delay component introduced in the left channel by the digital signal process i. As will be apparent to one skilled in the art, the fixed time delay component is caused by the presence of the digital circuitry as opposed to the processing performed by the digital circuitry. The output image enhanced right channel signal Rout is then used to drive a right channel amplifier and/or right side speaker(s) of the audio sound system. Thus, the present invention provides a rapid rate-of-change of phase between the stereo channels to a maximum of 180-degrees at substantially 200 Hz. This results in optimum symmetrical IPD compensation and a corresponding enhancement of stereophonic localization on both sides of an automobile listening environment. One skilled in the art will readily recognize that subcomponents i and j may be interposed to opposite channels without effecting the general concepts and performance characteristics of the present invention.

A subwoofer component 16 may be used for driving an optional subwoofer (not shown). A sample of left channel output signal Lout and a sample of right channel output signal Rout may serve as the inputs to the subwoofer component 16. These input signals are combined by summer k which provides as output a subwoofer signal Sout. Thus, the subwoofer signal Sout inherently exhibits constant phase characteristics above and below the narrow transition region. Additionally, the subwoofer signal Sout inherently exhibits an extremely rapid cut-off low pass filter function below substantially 200 Hertz by virtue of the above-described phase inversion characteristics between the input signals above 200 Hertz. Such characteristics of the subwoofer signal Sout are ideal for driving a subwoofer used to augment a conventional stereophonic sound system. This approach also eliminates the need for employing a high order low pass filter in derivation of the subwoofer signal. Again, the subwoofer component 16 may be implemented by analog or digital circuitry.

Figure 10:
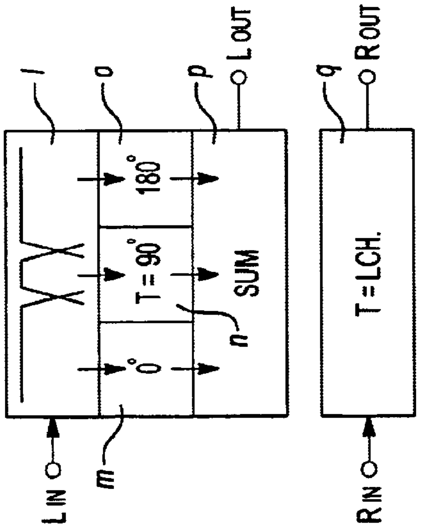
FIG. 10 is a block diagram of a first alternative embodiment of the compensating phase shift component of the present invention.

An alternative embodiment for the compensating phase shift component 14 is shown in FIG. 10. In this embodiment, the left channel input signal Lin is received into a filter bank l. Filter bank l may include low-pass, narrow band-pass, and high-pass filter functions. The output from the low-pass function is applied zero degrees of phase shift at throughput m. The output from the band-pass function is applied to a 90-degree phase shift process n which may include an equivalent time delay at such filter's center frequency. The output from the high-pass function l is applied to a 180-degree phase shift process o which includes a phase inverter. These outputs are then each applied to summer p which provides as output an image enhanced left channel signal Lout. As previously described, the right channel input signal Rin is applied to time delay q. Time delay q introduces a constant time delay equal to the fixed delay introduced into the left channel by the above-described digital signal processing. Time delay q provides as output an image enhanced right channel signal Rout.

Thus, the outputs of a non-inverting high-order low-pass filter, a 90-degree phase shifted narrow band-pass filter, and an inverting high-order high-pass filter are summed and applied to one channel. The inclusion of the 90-degree phase shifted narrow band-pass filter serves to preclude a cancellation efect in the frequency region between the low-pass and high-pass filters, since a 90-degree phase shifted signal sums properly with either a non-inverted (0-degree phase shift) or an inverted (180-degree phase shift) signal. Thus, a notch in the output response does not occur. Frequencies below, within, and above the narrow band-pass filter exhibit substantially 0-degree, 90-degree, and 180-degree phase shifts, respectively. In this way, a rapid rate-of-change of phase shift to a maximum of 180-degrees occurs about the narrow band-pass filter at substantially 200 Hz.

Figure 11:
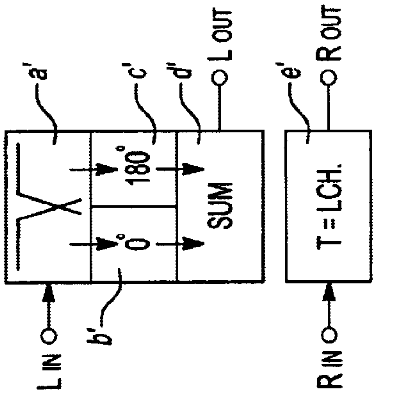
FIGS. 11 and 12 are block diagrams of a second and third alternative embodiment, respectively, of the compensating phase shift component of the present invention.

A second alternative embodiment for the compensating phase shift component 14 is shown in FIG. 11. The left channel input signal Lin is received into a filter bank a'. In this case, filter bank a' includes a low-pass filter function and a high-pass filter function. The low-pass output of filter bank a' is applied 0-degrees of phase shift at throughput b'. The high-pass output of filter bank a' is applied to a 180-degree phase shift process c' which includes a phase inverter. These outputs are then each applied to a summer d' which provides as output an image enhanced left channel signal Lout. The right channel input signal Rin is applied to time delay e'. Time delay e' introduces a constant time delay equal to the fixed delay introduced in the left channel and thereby provides as output an image enhanced right channel signal Rout.

In this approach, the narrow band-pass filter is eliminated and the cut-off frequencies of the non-inverting low-pass and inverting high-pass filters are substantially the same or narrowly separated. It is preferable to define the parameters of the low-pass and high-pass digital filters in such a way as to skew the phase in the stop-band relative to the phase in the pass-band of each such filter. The skewed phase stop-bands complicate the associated digital processing, but are necessary to avoid a phase cancellation that would otherwise occur in the overlap region between the opposing phase low-pass and high-pass filters.

Figure 12:
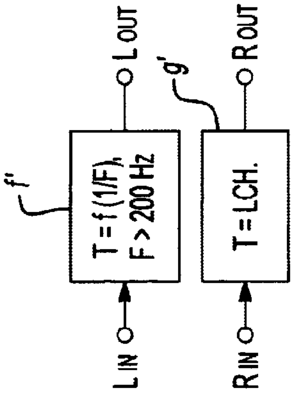

A third alternative embodiment for the compensating phase shift component 14 is shown in FIG. 12. In this instance, the left channel input signal Lin is applied to time delay function f. Time delay function f introduces time delay T that varies inversely as a function of frequency F above 200 Hz and remains constant below 200 Hertz. In this manner, the time delay function f may be aligned to provide a rapid rate-of-change in phase to a maximum of 180-degrees at substantially 200 Hertz. Thus, the time delay function f provides as output an image enhanced left channel signal Lout. The right channel input signal Rin is applied to time delay g'. Time delay g' introduces a constant time delay equal to the fixed delay introduced in the left channel below substantially 200 Hz and thereby provides as output image an enhanced right channel signal Rout. Thus, the time delay function varies inversely with frequency above substantially 200 Hz and is equivalent to the inverting high-pass filter. Alternatively, such time delay may vary as a function of all audio frequencies, most significantly, however, for frequencies above substantially 200 Hz.

Figure 13:
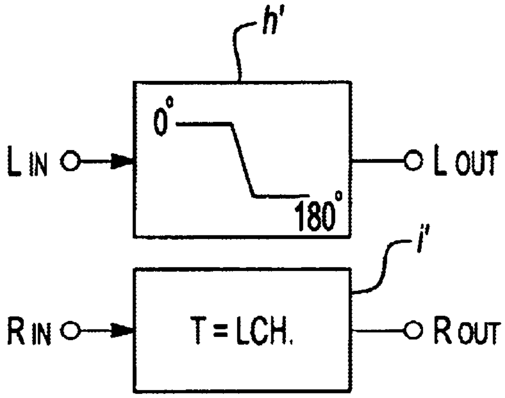
FIGS. 13 and 14 are block diagrams of a fourth and fifth alternative embodiment, respectively, of the compensating phase shift component of the present invention.

FIG. 13 depicts a fourth alternative embodiment for the compensating phase shift component of the present invention. In this case, the left channel input signal Lin is applied to a digital high-Q all-pass filter h' which provides a rapid rate-of-change of phase shift to a maximum of substantially 180-degrees. High-Q all-pass filter h' provides as output an image enhanced left channel signal Lout. More specifically, the Q factor for filter h' is greater than one and preferably freater than three. As will be apparent to one skilled in the art, the phase shift function of the high-Q all-pass filter h', in which maximum phase shift is limited to 180-degrees, may not ordinarily be implemented through an analog phase shifter or all-pass circuit. The right channel input signal Rin is applied to a time delay i'. Time delay i' introduces a constant time delay equal to the fixed delay introduced in the left channel and thereby provides as output an image enhanced right channel signal Rout. Thus, the high-Q all-pass filter is equivalent to the summed low-pass and high-pass filters, and it introduces a rapid rate-of-change of phase shift to a maximum of substantially 180-degrees at substantially 200 Hz.

Figure 14:
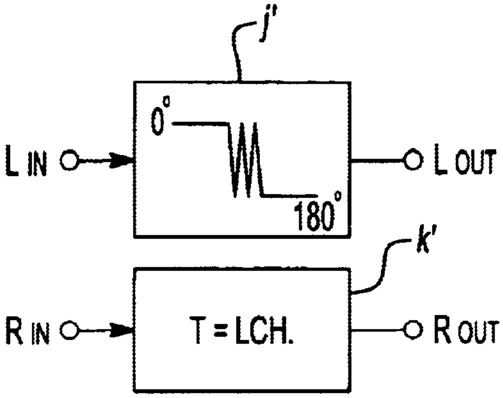

FIG. 14 depicts a fifth alternative embodiment for the compensating phase shift component of the present invention. The left channel input signal Lin is applied to a digital high-order all-pass filter j'. In this case, high-order all-pass filter j' provides a rapid rate-of-change of phase shift to a maximum of n(180) degrees, where n equals an odd integer greater than one, such that the total phase shift above substantially 200 Hz remains substantially 180-degrees. High-order all-pass filter j' provides as output an image enhanced left channel signal Lout. As will be apparent to one skilled in the art, high-order all-pass filter j', in which maximum phase shift is limited to an odd multiple of 180-degrees and occurs over a narrow frequency region, may not be ordinarily implemented through an analog phase shifter or all-pass circuitry. Tight channel input signal Rin is applied to a time delay k'. Time delay k' introduces a constant time delay equal to the fixed delay introduced in the left channel and thereby provides as output an image enhanced right channel signal Rout.

Figure 15:
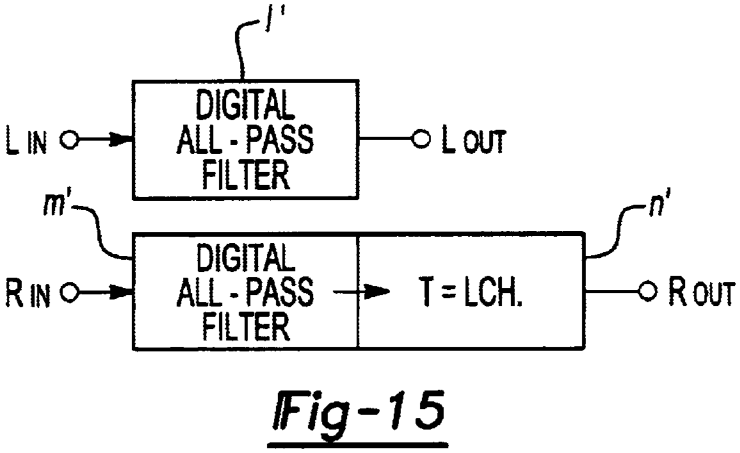
FIGS. 15 and 16 are block diagrams of a sixth and seventh alternative embodiment, respectively, of the compensating phase shift component of the present invention.

A sixth alternative embodiment for the compensating phase shift component 14 of the present invention is shown in FIG. 15. The left channel input signal Lin is applied to a first digital high-Q all-pass filter l'. In this embodiment, high-Q all-pass filter l' introduces a rapid rate-of-change of phase shift to a maximum first phase angle, thereby providing as output an image enhanced right channel signal Rout. Similarly, the right channel input signal Rin is applied to a second digital high-Q all-pass filter m' which introduces a rapid rate-of-change of phase shift to a maximum second phase angle, thereby providing as output an image enhanced right channel signal Rout. The maximum first phase angle and maximum second angle are selected to provide a maximum differential phase shift between the channels equal to substantially 180 degrees at substantially 200 Hz. To the extent necessary, the output from the high-Q all-pass filter m' (or alternatively from all-pass filter l') may optionally be processed by time delay n'. Time delay n' introduces a constant time delay equal to the fixed delay difference that may exist between the channels.

Figure 16:
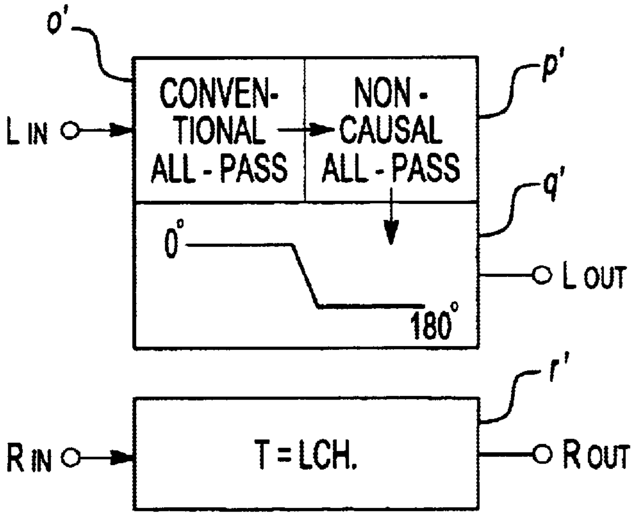

Lastly, a seventh alternative embodiment for the compensating phase shift component 14 of the present invention is shown in FIG. 16. The left channel input signal Lin is applied to at least one conventional all-pass filter o' which provides a positive phase shift function. The output of conventional all-pass filter o' is applied to at least one non-causal (time displaced) all-pass filter p'. The output of non-causal all-pass filter p' therefore combines positive phase shift and time displacement functions to provide a negative phase shift function q'. The negative phase shift function q' in turn provides as output an image enhanced left channel signal Lout. The right channel input signal Rin is applied to a time delay k'. Time delay k' introduces a constant time delay equal to the fixed delay introduced in the left channel and thereby provides as output an image enhanced right channel signal Rout. It is also envisioned that the conventional and non-causal all-pass filters may operate in opposing channels. When such filters operate in both channels, the constant delay may be eliminated or applied to either channel as may be required in specific applications. In any event, the conventional and non-causal all-pass filters are equivalent to the summed low-pass and high-pass filters, and thus introduce a rapid rate-of-change of phase shift to a maximum of substantially 180-degrees at substantially 200 Hz.

The foregoing discloses and describes merely exemplary embodiments of the present invention. One skilled in the art will readily recognize from such discussion, and from accompanying drawings and claims, that various changes, modifications, and variations can be made therein without departing from the spirit and scope of the present invention.

What is claimed is:

1. A digital signal processing system for symmetrical stereophonic image enhancement in an automotive listening environment, comprising:

input ports receiving stereo input signals from a stereo signal source;

output ports providing left and right stereo output signals;

a digital signal process interconnected between the input ports and the output ports, the digital signal process having left and right signal paths and further includes a phase shift device interposed into only one of the left and right signal paths and operative to insert a rapid rate-of-change phase shift to a maximum of substantially 180 degrees into the corresponding stereo signal; and a time delay device interposed into the remaining signal path and operative to introduce a time delay into the corresponding stereo signal.

2. The digital signal processing system of claim 1 wherein the phase shift device is operative to insert the rapid rate-of-change phase shift at substantially 200 Hertz.

3. The digital signal processing system of claim 1 wherein the phase shift device is operative to insert the rapid rate-of-change phase shift at a frequency within the range of 100 to 400 Hertz.

4. The digital signal processing system of claim 1 wherein the digital signal process further includes an adjustable clock, such that the frequency of the clock determines the frequency at which rapid rate-of-change phase shift occurs.

5. The digital signal processing system of claim 1 wherein the digital signal process is implemented using a digital circuit and the time delay is equal to a constant time delay component associated with the digital circuit of the phase shift device.

6. The digital signal processing system of claim 1 further comprising a spatial enhancement component interposed between the input ports and the digital signal process.

7. The digital signal processing system of claim 6 wherein the spatial enhancement component further comprises:

a first differential amplifier receiving a left stereo input signal and operative to generate a left minus right (l−r) difference signal;

a first equalizer having a step function, the first equalizer receiving the l−r difference signal and operative to generate an equalized l−r difference signal;

a first attentuator receiving the equalized l−r difference signal and operative to generate an attentuated l−r difference signal; and a first summer receiving the left stereo input signal and the attentuated l−r difference signal and operative to generate a spatially enhanced left channel signal.

8. The digital signal processing system of claim 6 wherein the spatial enhancement component further comprises:

a second differential amplifier receiving a right stereo input signal and operative to generate a right minus left (r−l) difference signal;

a second equalizer having a step function, the second equalizer receiving the r−l difference signal and operative to generate an equalized r−l difference signal;

a second attentuator receiving the equalized r−l difference signal and operative to generate an attentuated r−l difference signal; and a second summer receiving the right stereo input signal and the attentuated r−l difference signal and operative to generate a spatially enhanced right channel signal.

9. The digital signal processing system of claim 1 further comprising a summing circuit receiving the left and right stereo output signals from the output ports and operative to generate a summed output signal suitable for input to a low frequency subwoofer speaker.

10. The digital signal processing system of claim 1 wherein the phase shift device further comprises a non-inverting high-order low-pass filter, a 90-degree phase shifted narrow band-pass filter, and an inverting high-order high-pass filter, where each of the filters receives the same stereo input signal and generates a corresponding filtered output signal; and a signal summer receives the filtered output signal from each of the filters and generates a summed output signal, thereby providing a rapid rate-of-change phase shift to a maximum of 180-degree in the corresponding stereo signal.

11. The digital signal processing system of claim 1 wherein the phase shift device is further defined as a non-inverting high-order low-pass filter and an inverting high-order high-pass filter, where each of the filters receives the same stereo input signal and generates a corresponding filtered output signal; and a signal summer receives the filtered output signal from each of the filters and generates a summed output signal, thereby providing a rapid rate-of-change phase shift to a maximum of 180-degrees in the corresponding stereo signal.

12. The digital signal processing system of claim 1 wherein the phase shift device further comprises a non-linear time delay component that is operative to introduce a time delay that varies inversely with frequency above substantially 200 hertz and a constant time delay below substantially 200 hertz.

13. The digital signal processing system of claim 1 wherein the phase shift device further comprises a digital high-Q all-pass filter that is operative to insert a rapid rate-of-change phase shift to a maximum of 180 degrees into the corresponding stereo signal.

14. The digital signal processing system of claim 13 wherein the all-pass filter is defined as having a Q greater than one.

15. The digital signal processing system of claim 1 wherein the phase shift device further comprises a digital high-order all-pass filter that is operative to insert a rapid rate-of-change of phase to a maximum of n(180) degrees, where n equals an odd integer greater than 1 such that the phase shift remains substantially 180 degrees.

16. The digital signal processing system of claim 1 wherein the phase shift device further comprises a conventional all-pass filter having a positive phase shift function, and a non-causal all-pass filter having a time displaced negative phase shift function, wherein the positive phase shift function and the negative shift function operate sequentially, thereby providing a rapid rate-of-change phase shift to a maximum of 180-degrees in the corresponding stereo signal.

17. A digital signal processing system for symmetrical stereophonic image enhancement in an automotive listening environment, comprising:

input ports receiving stereo input signals from a stereo signal source;

output ports providing left and right stereo output signals;

a digital signal process interconnected between the input ports and the output ports, the digital signal process having left and right signal paths and further includes a first digital high-Q all-pass filter interposed into one of the left and right signal paths and operative to insert a rapid rate-of-change phase shift into the corresponding stereo signal; and a second digital high-Q all-pass filter interposed into the remaining signal paths and operative to insert a rapid rate-of-change phase shift into the corresponding stereo signal, wherein a rapid rate-of-change phase shift to a maximum of 180 degrees is provided between the stereo signals.

18. The digital signal processing system of claim 17 wherein at least one of the first all-pass filter and the second all-pass filter is operative to insert the rapid rate-of-change phase shift at substantially 200 Hertz.

19. The digital signal processing system of claim 17 wherein at least one of the first all-pass filter and the second all-pass filter is operative to insert the rapid rate-of-change phase shift at a frequency within the range of 100 to 400 Hertz.

20. The digital signal processing system of claim 17 wherein at least one of the first all-pass filter and the second all-pass filter further comprises a digital high-order all-pass filter that is operative to insert a rapid rate-of-change of phase to a maximum of n(180) degrees, where n equals an odd integer greater than 1 such that the phase shift remains substantially 180 degrees.

21. The digital signal processing system of claim 17 wherein the first all-pass filter further comprises a conventional all-pass filter having a positive phase shift function, and the second all-pass filter further comprises a non-causal all-pass filter having a time displaced negative phase shift function, thereby providing a rapid rate-of-change phase shift to a maximum of 180-degrees between the stereo signals.

22. The digital signal processing system of claim 17 wherein at least one of the first digital high-Q all-pass filter and the second digital high-Q all-pass filter is defined as having a Q greater than one.

23. The digital signal processing system of claim 17 wherein the digital signal process further comprises a time delay component interposed into one of the left and right signal paths and operative to introduce a time delay into the corresponding stereo signal that is equal to a constant time delay difference component between the first all-pass filter and the second all-pass filter.

24. A method for providing symmetrical stereophonic image enhancement in an automotive listening environment, comprising the steps of:

receiving a first channel input signal and a second channel input signal from a stereo signal source;

introducing a rapid rate-of-change phase shift to a maximum of substantially 180 degrees into only the first channel signal;

introducing a time delay into the second channel signal; and providing as output the first and second channel signals to output ports, thereby providing a symmetrical stereophonic image enhancement in the automotive listening environment.

25. The method of claim 24 wherein the step of introducing a rapid rate-of-change phase shift further comprises inserting the phase shift at substantially 200 Hertz.

26. The method of claim 24 further comprising the step of adjusting the frequency at which the rapid rate-of-change phase shift is inserted into the first channel signal within a range of 100 to 400 Hertz.

27. The method of claim 24 further comprising the step of providing a digital signal processing circuit interposed between the stereo signal source and the output ports for performing the steps of introducing a rapid rate-of-change phase shift and introducing a time delay.

28. The method of claim 27 wherein the time delay is equal to the duration of the phase shift occurring in the first channel signal.

29. The method of claim 24 further comprising the step of spatially enhancing the first channel input signal and the second channel input signal prior to the steps of introducing a rapid rate-of-change phase shift and introducing a time delay.

30. The method of claim 29 wherein the first channel signal is further defined as a left stereo signal, the second channel signal is further defined as a right stereo signal, and the step of spatially enhancing further comprises:

deriving a left-minus-right (l–r) difference signal;

equalizing the l–r difference signal;

attenuating the equalized l–r difference signal; and summing the attenuated l–r difference signal with the left side stereo signal, thereby generating a spatially enhanced left channel signal.

31. The method of claim 29 wherein the first channel signal is further defined as a left side stereo signal, the second channel signal is further defined as a right side stereo signal, and the step of spatially enhancing further comprises:

deriving a right-minus-left (r–l) difference signal;

equalizing the r–l difference signal;

attenuating the equalized r–l difference signal;

summing the attenuated r–l difference signal with the right side stereo signal, thereby generating a spatially enhanced right channel signal.

32. The method of claim 24 further comprising the step of summing the first channel signal and the second channel signal from the output ports, thereby generating a summed output signal suitable for input to a subwoofer speaker.

33. A method for providing symmetrical stereophonic image enhancement in an automotive listening environment, comprising the steps of:

receiving a first channel input signal and a second channel input signal from a stereo signal source;

introducing a rapid rate-of-change phase shift exclusively in the first channel signal, thereby providing a rapid rate-of-change phase shift to a maximum of 180 degrees between the channels; and providing as output the first and second channel signals to output ports, thereby providing a symmetrical stereophonic image enhancement in the automotive listening environment.

34. The method of claim 33 wherein the step of introducing a rapid rate-of-change phase shift further comprises inserting the phase shift at substantially 200 Hertz.

35. The method of claim 33 further comprising the step of adjusting the frequency at which the rapid rate-of-change phase shift is inserted into the first channel signal within a range of 100 to 400 Hertz.

36. The method of claim 33 further comprising the step of introducing a time delay into at least one of the first channel signal and the second channel signal, such that the time delay is equal to a constant time delay difference between the channels.

* * * * *